US010256395B2

(12) United States Patent
Lamborn et al.

(10) Patent No.: US 10,256,395 B2
(45) Date of Patent: Apr. 9, 2019

(54) CAPPED MAGNETIC MEMORY

(71) Applicant: Intel Corporation, Santa Clara, CA (US)

(72) Inventors: Daniel R. Lamborn, Hillsboro, OR (US); Oleg Golonzka, Beaverton, OR (US); Christopher J. Wiegand, Portland, OR (US); Philip E. Heil, Hillsboro, OR (US); M D Tofizur Rahman, Portland, OR (US); Rebecca J. Castellano, Beaverton, OR (US); Tarun Bansal, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/735,395

(22) PCT Filed: Jun. 19, 2015

(86) PCT No.: PCT/US2015/036555
§ 371 (c)(1),
(2) Date: Jan. 8, 2018

(87) PCT Pub. No.: WO2016/204774
PCT Pub. Date: Dec. 22, 2016

(65) Prior Publication Data
US 2018/0182952 A1    Jun. 28, 2018

(51) Int. Cl.
*H01L 29/82* (2006.01)
*H01L 43/02* (2006.01)
(Continued)

(52) U.S. Cl.
CPC ............ *H01L 43/02* (2013.01); *G11C 11/161* (2013.01); *H01L 27/226* (2013.01); *H01L 43/08* (2013.01); *H01L 43/10* (2013.01); *H01L 43/12* (2013.01)

(58) Field of Classification Search
CPC ....... H01L 43/02; H01L 27/226; H01L 43/08; H01L 43/10; H01L 43/12; G11C 11/161
See application file for complete search history.

(56) References Cited

U.S. PATENT DOCUMENTS 8,962,349 B1   2/2015   Chen et al.
2003/0190770 A1   10/2003   Yeom et al.
(Continued)

FOREIGN PATENT DOCUMENTS

JP    2003298150 A    10/2003
KR    20100076557 A    7/2010
(Continued)

OTHER PUBLICATIONS

The International Searching Authority, "Written Opinion of the International Searching Authority and the International Search Report" dated Mar. 17, 2016 in International Application No. PCT/US2015/036555.
(Continued)

*Primary Examiner* — Selim U Ahmed
*Assistant Examiner* — Andre Stevenson
(74) *Attorney, Agent, or Firm* — Trop, Pruner & Hu, P.C.

(57) ABSTRACT

An embodiment includes an apparatus comprising: a magnetic tunnel junction (MTJ), between first and second electrodes, comprising a dielectric layer between fixed and free layers; a dielectric film directly contacting sidewalls of the first electrode; and a metallic layer coupled to the sidewalls via the dielectric film; wherein (a) a vertical axis intersects the first and second electrodes and the MTJ but not the metallic layer, (b) a first horizontal axis intersects the metallic layer, the dielectric film, and the first electrode; and (c) a second horizontal axis, between the first horizontal axis
(Continued)

and the MTJ, intersects the dielectric film and the first electrode but not the capping layer. Other embodiments are described herein.

19 Claims, 7 Drawing Sheets

(51) Int. Cl.
  *H01L 43/08* (2006.01)
  *H01L 43/12* (2006.01)
  *G11C 11/16* (2006.01)
  *H01L 27/22* (2006.01)
  *H01L 43/10* (2006.01)

(56) References Cited

U.S. PATENT DOCUMENTS

| | | |
|---|---|---|
| 2004/0127054 A1 | 7/2004 | Lee et al. |
| 2007/0029277 A1 | 2/2007 | Jacobowitz et al. |
| 2009/0108888 A1 | 4/2009 | Gebara et al. |
| 2009/0141543 A1 | 6/2009 | Ho et al. |
| 2009/0159562 A1 | 6/2009 | Cho et al. |
| 2009/0261437 A1 | 10/2009 | Kang et al. |
| 2009/0321859 A1 | 12/2009 | Li et al. |
| 2011/0044096 A1 | 2/2011 | Li |
| 2012/0205764 A1 | 8/2012 | Chen et al. |
| 2013/0034917 A1 | 2/2013 | Lee |
| 2013/0284572 A1 | 10/2013 | Teh et al. |
| 2014/0138347 A1 | 5/2014 | Toyosato et al. |
| 2014/0264664 A1 | 9/2014 | Abraham et al. |
| 2015/0021675 A1 | 1/2015 | Min |
| 2015/0188033 A1 | 7/2015 | Lamborn et al. |
| 2015/0194599 A1* | 7/2015 | Park .................. H01L 43/12 438/3 |
| 2015/0340593 A1 | 11/2015 | Lu et al. |

FOREIGN PATENT DOCUMENTS

| | | |
|---|---|---|
| TW | 200726641 A | 7/2007 |
| TW | 201007729 A | 2/2010 |
| TW | 201332075 A | 8/2013 |

OTHER PUBLICATIONS

U.S. Appl. No. 14/140,758, filed Dec. 26, 2013, entitled "Methods of Forming a Magnetic Random Access Memory Etch Spacer and Structures Formed Thereby," by Daniel R. Lamborn et al.
Taiwan Patent Office, Office Action dated Mar. 18, 2016 in Taiwanese Patent Application No. 10310657, 20 pages with translation.
The International Searching Authority, "Written Opinion of the International Searching Authority and the International Search Report" dated Apr. 28, 2015 in International Application No. PCT/US2014/065984.
European Patent Office, Extended European Search Report dated Jan. 30, 2019 in European Patent Application No. 15895816.5, six pages.

* cited by examiner

CAPPED MAGNETIC MEMORY

TECHNICAL FIELD

Embodiments of the invention are in the field of semiconductor devices and, in particular, magnetic memory.

BACKGROUND

As described in U.S. Patent Application Publication 2015/0091110, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

The operation of spin torque devices is based on the phenomenon of spin transfer torque (STT). If a current is passed through a magnetization layer, called the fixed magnetic layer, the current output from the magnetization layer will be spin polarized. With the passing of each electron, its spin (angular momentum) will be transferred to the magnetization in the next magnetic layer, called the free magnetic layer, and will cause a small change on its magnetization. This is, in effect, a torque-causing precession of magnetization. Due to reflection of electrons, a torque is also exerted on the magnetization of an associated fixed magnetic layer. In the end, if the current exceeds a certain critical value (which is a function of damping caused by the magnetic material and its environment), the magnetization of the free magnetic layer will be switched by a pulse of current, typically in about 1-10 nanoseconds. Magnetization of the fixed magnetic layer may remain unchanged since an associated current is below its threshold due to geometry or due to an adjacent anti-ferromagnetic layer(s).

Spin-transfer torque can be used to flip the active elements in magnetic random access memory. Spin-transfer torque memory (STTM) has the advantages of lower power consumption and better scalability over conventional magnetic random access memory (MRAM) which uses magnetic fields to flip the active elements.

BRIEF DESCRIPTION OF THE DRAWINGS

Features and advantages of embodiments of the present invention will become apparent from the appended claims, the following detailed description of one or more example embodiments, and the corresponding figures. Where considered appropriate, reference labels have been repeated among the figures to indicate corresponding or analogous elements.

DETAILED DESCRIPTION

Figure 1:
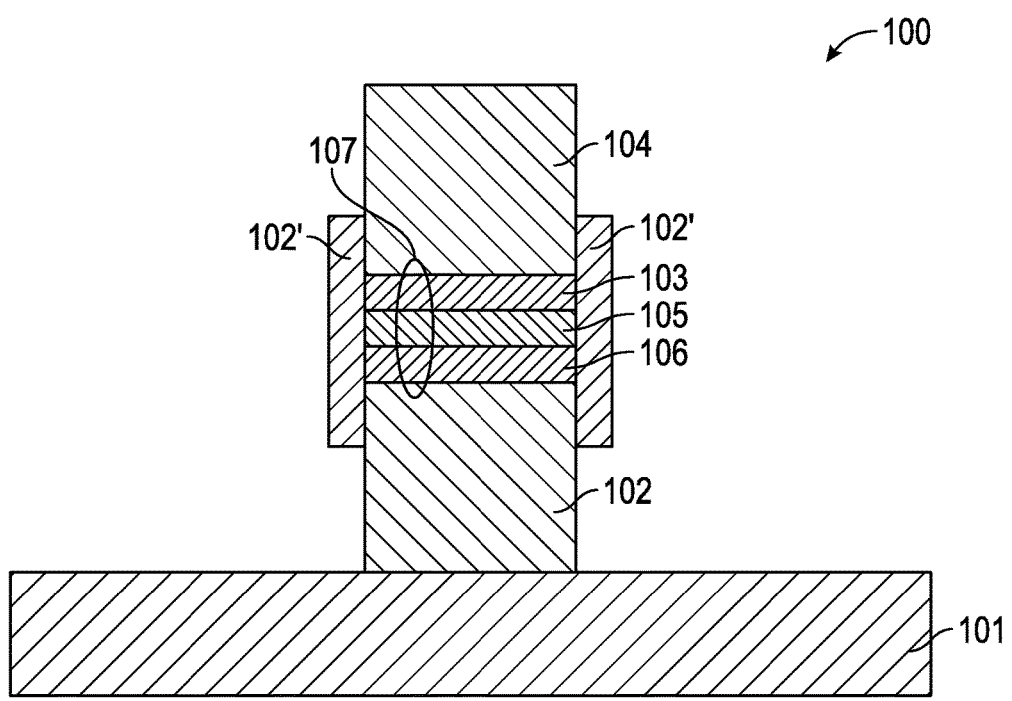
FIG. 1 includes a conventional MTJ stack.

Reference will now be made to the drawings wherein like structures may be provided with like suffix reference designations. In order to show the structures of various embodiments more clearly, the drawings included herein are diagrammatic representations of semiconductor/circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings. For example, not every layer of a semiconductor device is necessarily shown. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact.

As described above, STTM has low power consumption and good scalability over conventional MRAM. However, STTMs can suffer from poor stability when aggressively scaled. Stability is one of the most important issues facing scaling of STTM based devices and memory arrays fabricated there from. As scaling continues, the need for smaller memory elements to fit into a scaled cell size has driven the industry in the direction of perpendicular STTMs, which have higher stability for small memory element sizes.

Common perpendicular STTMs are achieved with a material layer stack that includes a bottom electrode, a fixed magnetic layer, a dielectric layer (e.g., MgO), a free magnetic layer (e.g., CoFeB), a capping layer (e.g., Ta), and a top electrode. A magnetic tunnel junction (MTJ) portion of the material layer stack includes the fixed magnetic layer, the dielectric layer, and the free magnetic layer. A perpendicular STTM uses a perpendicular MTJ (pMTJ) as a memory element. This material stack is a basic material stack for fabricating STTM, and may be fabricated with greater complexity. For example, anti-ferromagnetic layers may also be included between the bottom electrode and fixed magnetic layer. Additionally, electrodes may themselves include multiple layers of material with differing properties. The material stack may, in its most basic form, be an in-plane system, where spins of the magnetic layers are in a same plane as the layers themselves.

Regarding pMTJs more specifically, with layer or interface engineering the material stack may be fabricated to provide a perpendicular spin system. In an example, a free magnetic layer (e.g., a free magnetic layer composed of CoFeB) is thinned down from a conventional thickness used for in-plane STTM devices. The extent of thinning may be sufficient such that a perpendicular component obtained from the iron/cobalt (Fe/Co) in the free magnetic layer interacting with oxygen in the dielectric layer (e.g., interacting with a magnesium oxide (MgO) layer) dominates over the in-plane component of the free CoFeB layer. This example provides a perpendicular system based on a single layer system of coupling to one interface of the free layer (i.e., the CoFeB—MgO interface). The degree of oxidation of surface iron/cobalt atoms (Fe/Co) in the CoFeB layer by oxygen from the MgO layer provides the strength (stability) of the free layer to have perpendicular-dominated spin states. Thickness of the fixed magnetic layer also determines magnetization direction in the same manner as in the thickness of a free magnetic layer. Other factors may also determine the direction of magnetization. For example, factors such as surface anisotropy (depending on the adjacent layers or a multi-layer composition of the ferromagnetic layer) and/or crystalline anisotropy (depending on stress and the crystal lattice structure modification such as FCC, BCC, or L10-type of crystals, where L10 is a type of crystal class which exhibits perpendicular magnetizations), can also determine the direction of magnetization.

As a pMTJ is aggressively scaled, it not only has issues with stability but it also faces issues due to etching. More specifically, during fabrication of the device, various etch processing steps may be employed. Such etch processing may involve non-volatile source materials, and may create non-volatile byproducts. The non-volatile by-products, which may originate from electrode material, may redeposit on the tunnel junction during etch processing, and may cause electrical shorting between the electrodes. In order to prevent device failure from the electrical shorting, a spacer of non-electrical conducting material can be used to separate the top and bottom electrodes of the device.

FIG. 1 includes an MTJ stack 100 including bottom electrode 102, MTJ 107, and top electrode 104, all of which are on substrate 101. MTJ 107 may include a dielectric tunneling barrier 105 between fixed layer 106 and free layer 103. The sublayers of MTJ 107 are not always illustrated herein as, for example, the exact number of sublayers of fixed layer (e.g., alternating layers of Cobalt (Co) and Platinum (Pt)) are not always crucial to an understanding of the novelty of the embodiment in question. The MTJ stack 100 is formed from larger layers of substrate 101, a metal layer for bottom electrode 102, free and fixed and dielectric layers for MTJ 107, and another metal layer for top electrode 104. To form the actual MTJ stack 100 the top electrode 104 may be etched followed by an etch to form the MTJ 107 and finally an etched to form the bottom electrode 102. However, while etching bottom electrode 102 bottom electrode byproduct may be deposited along stack sidewalls in portions 102'. Considering the byproduct is from a metal electrode etch, the byproduct may include conductive elements (e.g., metal) that then create an electrical short between electrodes 102, 104 via portions 102'. The short can lead to failure of MTJ 107.

Issues of etching a MTJ/pMTJ stack are not limited to the redeposition of the bottom electrode along a portion of the top electrode. Another issue involves when etching the MTJ stack, the top electrode or hard-mask material has poor selectivity and is therefore consumed or damaged while etching the bottom electrode. Put another way, the top electrode is etched once when the top electrode is initially etched and the top electrode patterning is the target of the etch. However, after etching the MTJ, the etch of the bottom electrode may not have sufficient selectivity to preserve the top electrode from damage. As a result, the bottom electrode is etched but so is the top electrode albeit for a second time (which is unintended in the second case). In addition, any materials deposited around the top electrode may be etched (e.g., free layer of MTJ or other metal layers exposed during second electrode etch) or damaged during the bottom electrode etch.

However, an embodiment includes methods and associated structures of forming and utilizing microelectronic structures, such as MTJ or pMTJ device structures, are described. Those methods/structures may include forming a protective film material on a top electrode of a MTJ structure (e.g., a pMTJ or non-perpendicular MTJ), and then forming a highly selective capping layer on the protective film prior to etching a bottom electrode of the MTJ device. The MTJ device structures of the various embodiments disclosed herein enable the fabrication of MRAM devices which do not exhibit shorting between the ferromagnetic electrodes.

For example, an embodiment uses a protective film over the MTJ stack sidewalls and a capping material over the protective film. The capping material has high etch selectivity compared to the bottom electrode etch process. As a result, the cap is not overly processed or removed during the bottom electrode etch, thereby preserving the protective film and the top electrode and ensuring any redeposited bottom electrode is redeposited onto the protective film sidewalls and not onto the top and bottom electrode sidewalls.

This provides an advantage over prior efforts to protect the top electrode. For example, a conventional approach to preserve the top electrode is to use thicker top electrodes. However, a thicker top electrode has disadvantages such as, for example, a tall top electrode can reduce angles needed for ion based etching and therefore result in a larger and less desirable critical dimension (CD), which reduces desired scalability capability for the memory. As the CD increases, two adjacent MTJ stacks may contact each other resulting in a short.

Please note that at times "hard mask" and "top electrode" are used interchangeably considering they can be one in the same in some embodiments. However, other embodiments may include a hard mask and a top electrode. In such an embodiment, the hard mask would be on the top electrode with the protective film and capping layer on the hard mask. Any such hard mask may be removed from the top electrode during processing steps that follow bottom electrode etching.

Figure 2A:
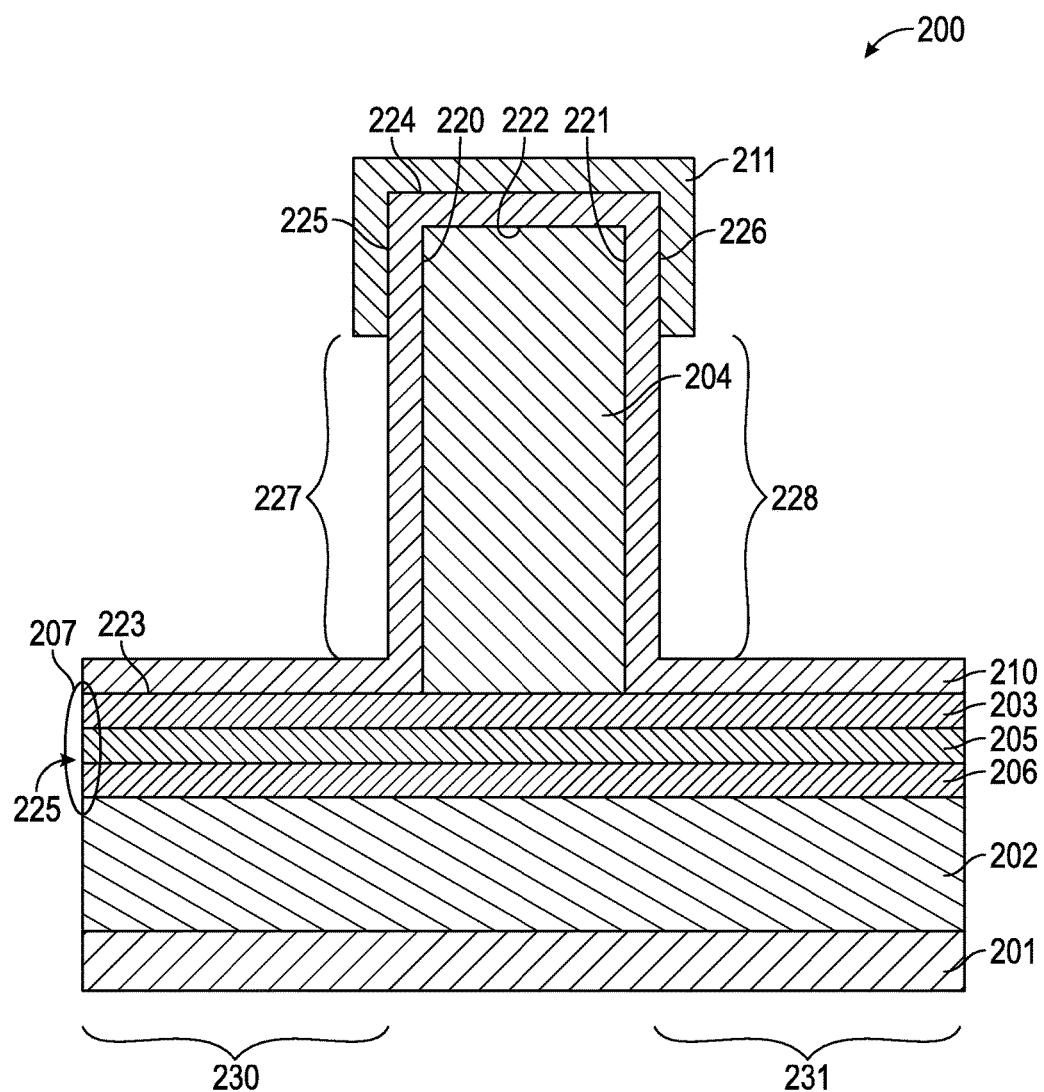
FIGS. 2A-B include MTJ stacks in embodiments of the invention.

FIG. 2a includes an MTJ stack 200 including bottom electrode 202, MTJ 207, and top electrode 204, all of which are on substrate 201. Top electrode 204 may include tantalum (Ta), titanium (Ti), titanium nitride (TiN), and the like. Bottom electrode 202 may include Ruthenium (Ru), copper (Cu), and the like. In an embodiment, the bottom electrode and/or the top electrode may comprise ferromagnetic materials, such as cobalt-iron alloys. In an embodiment, the top and bottom electrodes comprise non-volatile materials.

MTJ 207 may include a dielectric tunneling barrier 205 between fixed layer 206 and free layer 203. In an embodiment, the tunnel barrier layer 205 may comprise a dielectric material, such as an oxide material (e.g. MgO or $Al_2O_3$), for example, and may comprise a thickness of about 0.8 nanometers to about 1.5 nanometers. The sublayers of MTJ 207 are not always illustrated herein as, for example, the exact number of sublayers of a fixed layer (e.g., alternating layers Co and Pt) are not always crucial to an understanding of the novelty of the embodiment in question. Protective film 210 covers the top 222 and side walls 220, 221 of top electrode 204 and top 223 of MTJ 207. In an embodiment film 210 directly contacts both top and bottom electrodes 204, 202. In an embodiment, protective film 210 is non-conductive. For example, film 210 may include an oxidation layer. For example, film 210 may include silicon nitride ($Si_3N_4$), silicon carbide (CSi), hafnium oxide ($HfO_2$), and/or combinations or sublayers thereof. Film 210 may be between 1-20 nm in an embodiment.

In an embodiment capping layer 211 is formed over the top 224 and side walls 225, 226 of layer 210 and top electrode 204. The formation process may be a deposition process such as physical vapor deposition (PVD), atomic layer deposition (ALD), chemical vapor deposition (CVD), or plasma-enhanced chemical vapor deposition (PECVD). Layer 211 may include TiN, Ti, Ta, tungsten (W), (TaN), and alloys thereof. The capping layer is "highly selective" and may comprise a metallic material in an embodiment. In another embodiment, the highly selective material 211 may comprise any such material that is highly selective as compared with the bottom electrode 202 material during an etching process. For example, during a bottom electrode etching process, the highly selective material 211 will exhibit little to no etching (removal), while the bottom electrode 202 material may be etched at a much higher rate. In an embodiment, the highly selective material may be etched at a rate that may be about 100 to about 1000 times less than the etch rate for the bottom electrode 202, for a given bottom electrode 202 etch chemistry.

Layer 211 may be 1-10 nm thick in an embodiment. Cap or "helmet" layer 211 may not extend all along sidewalls 225, 226 of top electrode 204 instead leaving portions 227, 228 exposed. In an embodiment cap layer 211 directly contacts film 210 but in other embodiments layer 211 indirectly couples to layer 210. In an embodiment, cap 211 extends about 25-35% (+/−10%) along sidewalls 225, 226 leaving the remaining portions 227, 228 comprising 75-65% (+/−10%) exposure of the MTJ stack 200.

Thus, FIG. 2a discloses a capped stack 200 including a patterned hard mask and/or top electrode 204. The top electrode or hard mask is encapsulated with protective film 210, which may include a dielectric and/or include multiple films of different materials.

Figure 2B:
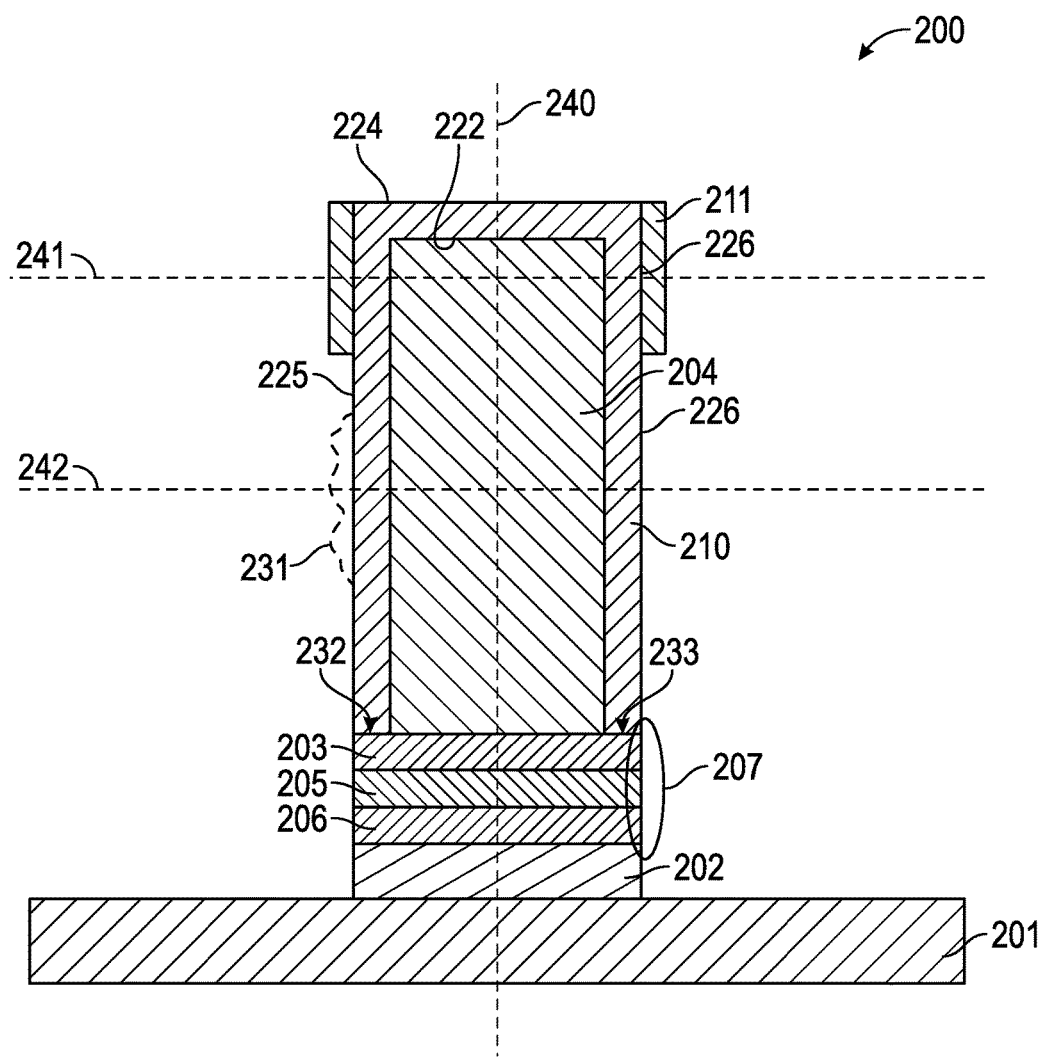

FIG. 2b includes stack 200 once the bottom electrode 202 and MTJ 207 have been etched. The etchant used may be, for example, ammonia ($NH_3$)/argon (Ar) mixture, methanol ($CH_4O$)/Ar mixture, methane/hydrogen/argon mixture, $NH_3$/Ar/carbon monoxide (CO), as well as many others such as ion beam etching. While some or all of upper portions of cap 211, and protective film 210 have been removed during the bottom electrode etch, portions of layers 210, 211 remain protecting top electrode 204. Film 210 even protects top portions 232, 233 of MTJ 207. For example, film 201 may directly contact MTJ stack portions 232, 233. Any redeposit of electrode 204 (see redeposit portion 231) would be formed along sidewalls 225, 226 of layer 210, avoiding any shorting between electrodes 202, 204. In an embodiment, in a final MTJ stack capping layer 211 may be completely removed from top surface 224 due to etching, polishing, and the like. In an embodiment, in a final MTJ stack protective film layer 210 may be completely removed from top surface 222 due to etching, polishing, and the like.

In other words, during the bottom electrode 202 and MTJ 207 etching steps capping layer 211, due to its etch resistance (high selectivity), protects the top electrode 204 and upper portions of protective film 210 from damage or erosion. The capping layer 211 may be partially consumed during the MTJ and bottom electrode processing steps but electrode 204 remains protected.

Figure 3A:
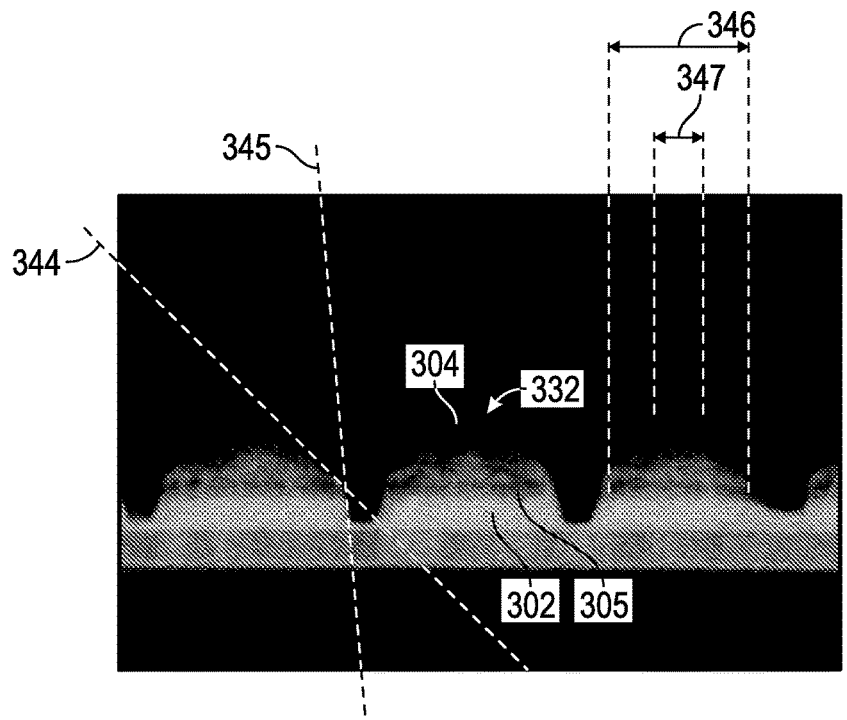
FIG. 3a includes images of etched MTJ stack with no capping layers and FIG. 3b includes images of etched MTJ stacks with capping layers.
Figure 3B:
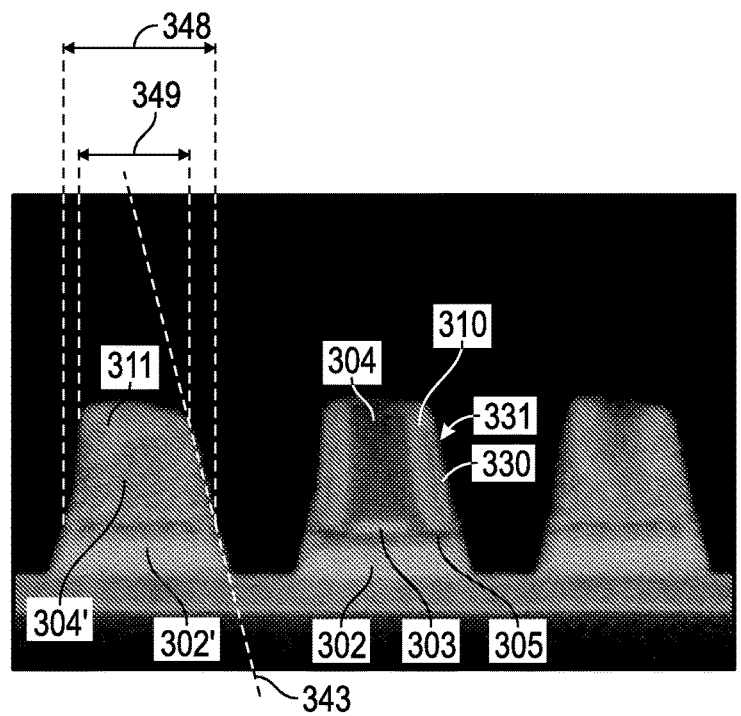

FIG. 3a includes an image of etched MTJ stacks with no capping layers and FIG. 3b includes an image of etched MTJ stacks with capping layers. Due to the lack of capping layers, FIG. 3a shows a sidewall 332 that is severely angled showing large removal of both top electrode 304 and likely MTJ as well. Dielectric 305 of the MTJ is labeled and is shown on top of bottom electrode 302.

In contrast, FIG. 3b shows a slightly angled side wall 331 with good preservation of top electrode 304 and MTJ, including MTJ dielectric 305 (which is on top of bottom electrode 302) and free layer 303. Preservation layer 310 is visible as is second electrode re-deposition 330, which is not shorting top and bottom electrodes 304, 302. In some embodiments the capping layer may be consumed during bottom electrode etching. However, other embodiments may retain remnants of the capping layer (see capping layer 311 in FIG. 3b) as evidenced with, for example, transmission electron microscopy (TEM) (to provide an image of different layers) with energy-dispersive X-ray spectroscopy (EDX) (to determine whether materials forming the cap layer are present).

Figure 6:
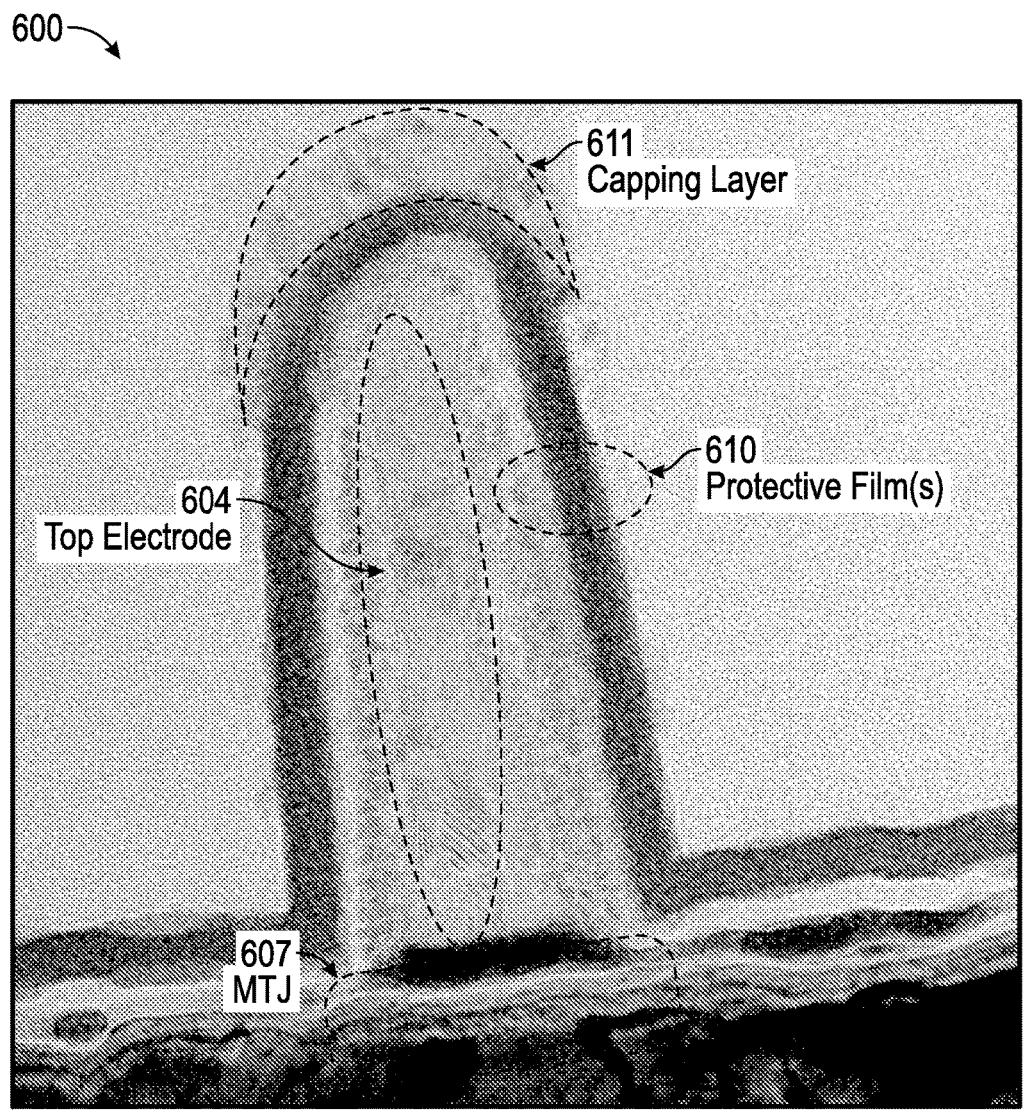
FIG. 6 includes an image of an embodiment of the invention.

FIG. 6 includes an image in an embodiment. MTJ stack 600 includes capping layer 611 on protective film 610 (which may be a plurality of sublayers), which is on top electrode 604. MTJ 607 is below the top electrode 604. This image is taken before the MTJ and bottom electrode are etched. Capping layer 611 is positioned to protect the top electrode and part of the protective film 610 during etching of the bottom electrode. As described herein, the capping layer does not extend all the way down the sidewalls of the first electrode to minimize CD enlargement issues. However, an additional reason for layer 611 to be positioned primarily at the top only is that the top of the stack is what would experience the greatest amount of etching and which therefore needs the most protection.

Figure 4:
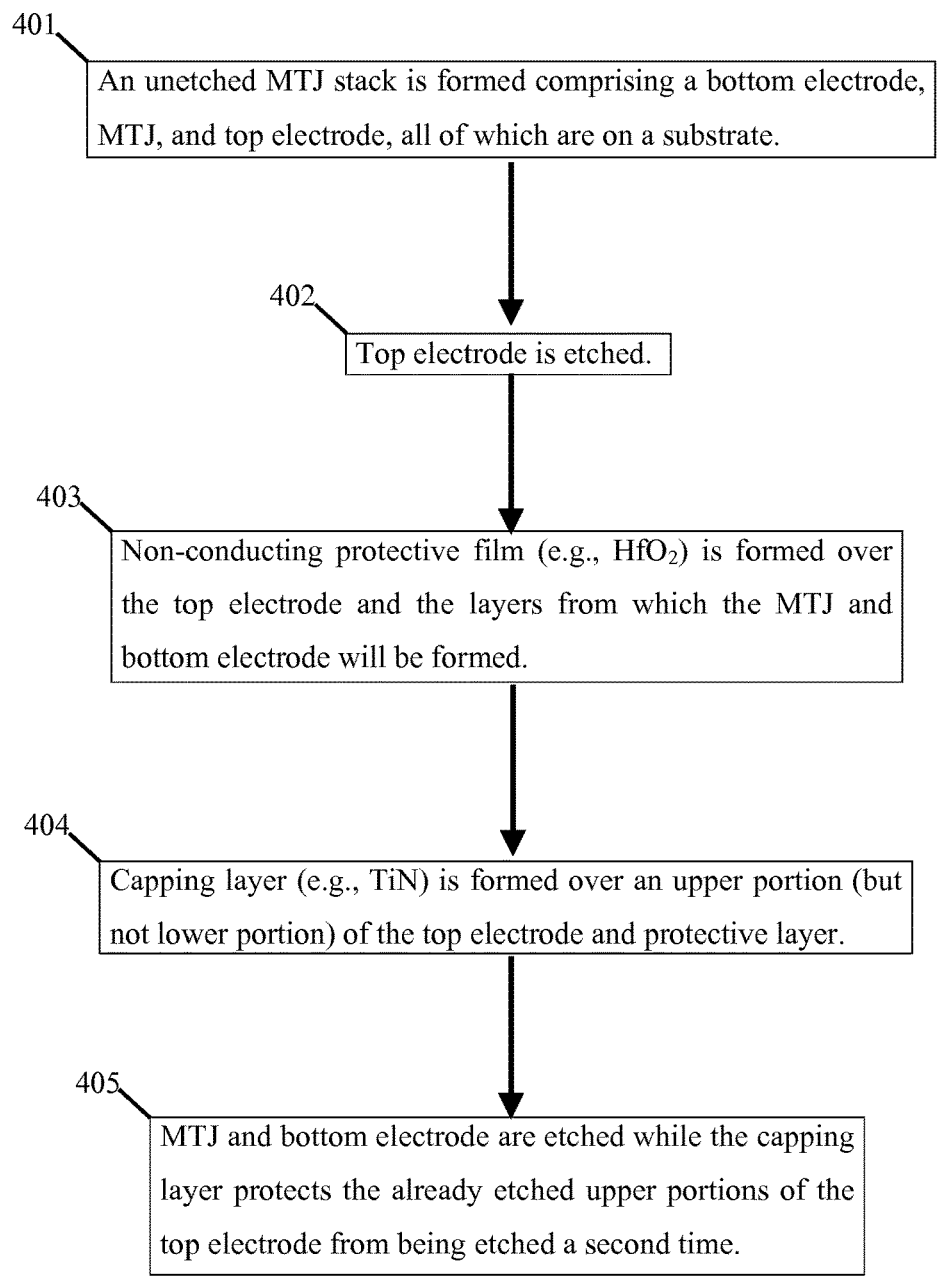
FIG. 4 includes a method in an embodiment of the invention.

FIG. 4 includes a process 400 in an embodiment. In block 401 an unetched MTJ stack is formed comprising a bottom electrode, MTJ, and top electrode, all of which are on a substrate. In block 402 the top electrode is etched. In block 403 a non-conducting protective film (e.g., $HfO_2$) is formed over the top electrode and the layers from which the MTJ and bottom electrode will be formed. In block 404 a capping layer (e.g., TiN) is formed over an upper portion (but not lower portion) of the top electrode and protective layer. In block 405 the MTJ and bottom electrode are etched while the capping layer protects the already etched upper portions of the top electrode from being etched a second time. Even though some of the bottom electrode may be re-deposited onto the highly selective capping layer and/or protective film during etching, the top and bottom electrodes are not shorted between each other due to the presence of the highly selective capping layer and/or protective film that prevents electrode re-deposition onto the top electrode during the bottom electrode etch process.

Thus, one or more embodiments are directed to MTJ based devices. When a MTJ is described herein other embodiments may exchange a pMTJ for the MTJ to form pMTJ based devices. Such devices include, for example, perpendicular STTM systems. Applications may include use of MTJs in embedded memory, embedded non-volatile memory (NVM), magnetic random access memory (MRAM), NVM, and non-embedded or stand-alone memories.

In an embodiment, stack 200 may be located on a substrate, which may include Silicon (Si), SiGe, and the like. The substrate may include a semiconductor on insulator (SOI) substrate. The insulator may include $SiO_2$ or the like. In an embodiment the substrate has a height or thickness of 100 nm. "Thickness" or "height" as used herein is in the vertical direction of FIG. 2a, whereas "width" would be in the horizontal direction of FIG. 2a. Also, electrode 204 is on "top" of electrode 202. In some embodiments layers 203, 206 include CoFeB in varying combinations such as, for example, $Co_{20}Fe_{60}B_{20}$. Layers 203, 206 may be 1 nm thick in some embodiments. Dielectric layer 205 may include MgO and may be 1 nm thick. Free layer 203 and fixed layer 206 may include sublayers (not shown).

Various embodiments disclosed herein have addressed MTJs (which can be exchanged with pMTJs in other embodiments). Any such MTJ may be used in a memory cell by coupling one portion or node of the MTJ stack (e.g., top electrode 204 of FIG. 2b) to a bit-line and another node of the MTJ stack (e.g., bottom electrode 202 of FIG. 2b) to a source or drain node of a switching device, such as a selection transistor. The other of the source and drain node of the selection transistor may be coupled to a source line of the memory cell. The gate of the selection transistor may couple to a word-line. Such a memory cell may utilize TMR of the MTJ to store memory states. Embodiments provided herein provide an increase in stability for the memory states and reliability (avoids shorts between electrodes). Such embodiments subsequently provide more stable and power efficient memory cells that can be scaled below, for example, 22 nm CD. The STT memory cell may couple to a sense amplifier. A plurality of the STT memory bit cells may be operably connected to one another to form a memory array, wherein the memory array can be incorporated into a non-volatile memory device. It is to be understood that the selection transistor may be connected to the top electrode or the bottom electrode of a MTJ stack.

Figure 5:
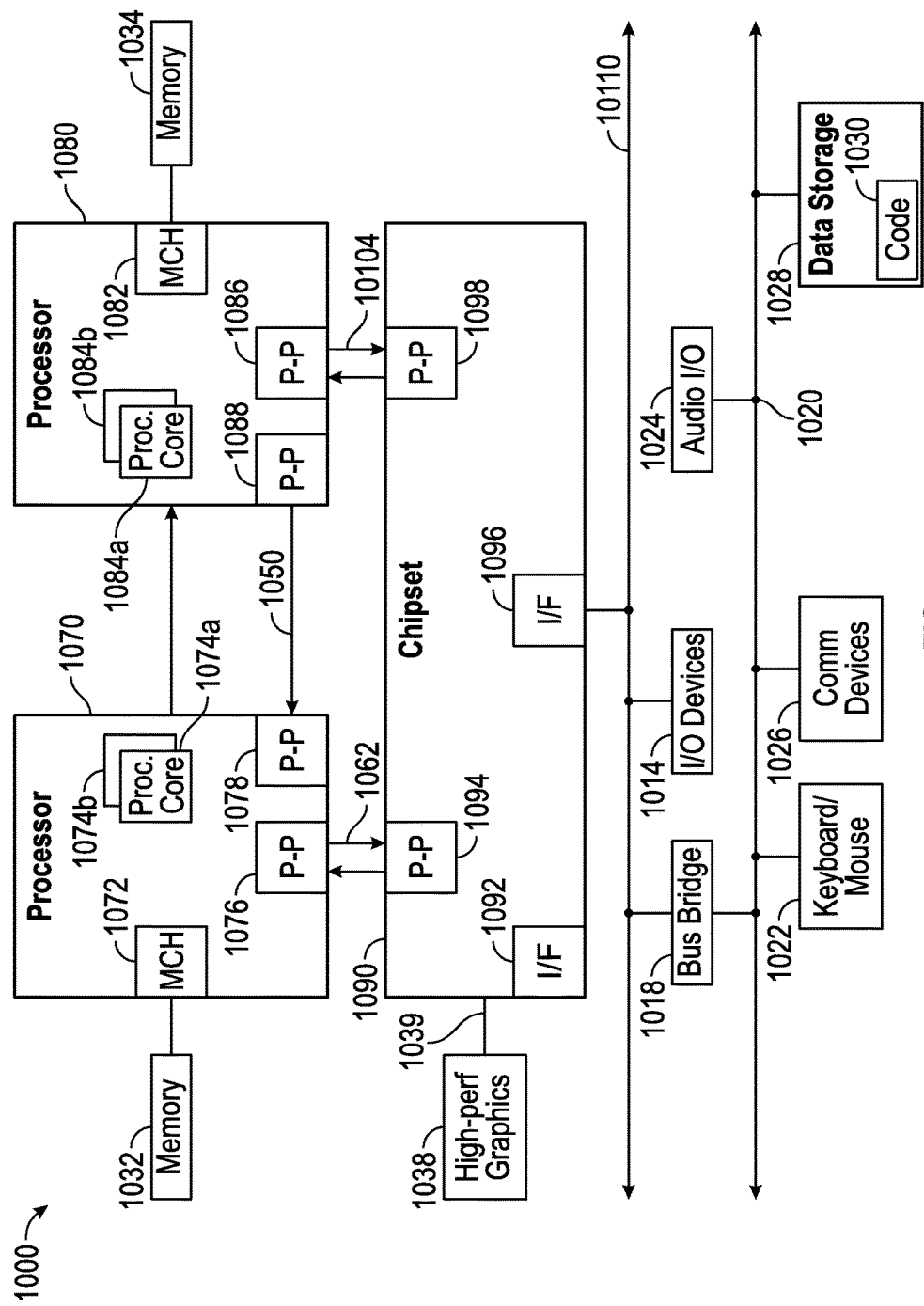
FIG. 5 includes a system comprising a memory cell within which an embodiment of the invention is included.

FIG. 5 includes a system that may include the above described memory cell. FIG. 5 includes a block diagram of a system embodiment 1000 in accordance with an embodiment of the present invention. System 1000 may include hundreds or thousands of the above described memory cells and be critical to memory functions in, for example, system 1000. System 100 may include a mobile computing node such as a cellular phone, smartphone, tablet, Ultrabook®, notebook, laptop, personal digital assistant, and mobile processor based platform. The stability and power efficiency of such memory cells accumulates when the memory cells are deployed in mass and provides significant performance advantages (e.g., longer battery life, longer memory state storage in a broader range of operating temperatures) to such computing nodes. In other words, the ability to have a lower CD near the bottom electrode (while still avoiding shorts between electrodes) allows for more aggressive scaling, which allows for greater power efficiency.

Shown is a multiprocessor system 1000 that includes a first processing element 1070 and a second processing element 1080. While two processing elements 1070 and 1080 are shown, it is to be understood that an embodiment of system 1000 may also include only one such processing element. System 1000 is illustrated as a point-to-point interconnect system, wherein the first processing element 1070 and second processing element 1080 are coupled via a point-to-point interconnect 1050. It should be understood that any or all of the interconnects illustrated may be implemented as a multi-drop bus rather than point-to-point interconnect. As shown, each of processing elements 1070 and 1080 may be multicore processors, including first and second processor cores (i.e., processor cores 1074a and 1074b and processor cores 1084a and 1084b). Such cores 1074, 1074b, 1084a, 1084b may be configured to execute instruction code.

Each processing element 1070, 1080 may include at least one shared cache or memory unit which may include pMTJs described herein. The shared cache may store data (e.g., instructions) that are utilized by one or more components of the processor, such as the cores 1074a, 1074b and 1084a, 1084b, respectively. For example, the shared cache may locally cache data stored in a memory 1032, 1034 for faster access by components of the processor. In one or more embodiments, the shared cache may include one or more mid-level caches, such as level 2 (L2), level 3 (L3), level 4 (L4), or other levels of cache, a last level cache (LLC), and/or combinations thereof.

While shown with only two processing elements 1070, 1080, it is to be understood that the scope of the present invention is not so limited. In other embodiments, one or more additional processing elements may be present in a given processor. Alternatively, one or more of processing elements 1070, 1080 may be an element other than a processor, such as an accelerator or a field programmable gate array. For example, additional processing element(s) may include additional processors(s) that are the same as a first processor 1070, additional processor(s) that are heterogeneous or asymmetric to first processor 1070, accelerators (such as, e.g., graphics accelerators or digital signal processing (DSP) units), field programmable gate arrays, or any other processing element. There can be a variety of differences between the processing elements 1070, 1080 in terms of a spectrum of metrics of merit including architectural, microarchitectural, thermal, power consumption characteristics, and the like. These differences may effectively manifest themselves as asymmetry and heterogeneity amongst the processing elements 1070, 1080. For at least one embodiment, the various processing elements 1070, 1080 may reside in the same die package.

First processing element 1070 may further include memory controller logic (MC) 1072 and point-to-point (P-P) interfaces 1076 and 1078. Similarly, second processing element 1080 may include a MC 1082 and P-P interfaces 1086 and 1088. MC's 1072 and 1082 couple the processors to respective memories, namely a memory 1032 and a memory 1034, which may be portions of main memory locally attached to the respective processors. Memory 1032, 1024 may include pMTJs described herein. While MC logic 1072 and 1082 is illustrated as integrated into the processing elements 1070, 1080, for alternative embodiments the MC logic may be discreet logic outside the processing elements 1070, 1080 rather than integrated therein.

First processing element 1070 and second processing element 1080 may be coupled to an I/O subsystem 1090 via P-P interfaces 1076, 1086 via P-P interconnects 1062, 10104, respectively. As shown, I/O subsystem 1090 includes P-P interfaces 1094 and 1098. Furthermore, I/O subsystem 1090 includes an interface 1092 to couple I/O subsystem 1090 with a high performance graphics engine 1038. In one embodiment, a bus may be used to couple graphics engine 1038 to I/O subsystem 1090. Alternately, a point-to-point interconnect 1039 may couple these components.

In turn, I/O subsystem 1090 may be coupled to a first bus 10110 via an interface 1096. In one embodiment, first bus 10110 may be a Peripheral Component Interconnect (PCI) bus, or a bus such as a PCI Express bus or another third generation I/O interconnect bus, although the scope of the present invention is not so limited.

As shown, various I/O devices 1014, 1024 may be coupled to first bus 10110, along with a bus bridge 1018 which may couple first bus 10110 to a second bus 1020. In one embodiment, second bus 1020 may be a low pin count (LPC) bus. Various devices may be coupled to second bus 1020 including, for example, a keyboard/mouse 1022, communication device(s) 1026 (which may in turn be in communication with a computer network), and a data storage unit 1028 such as a disk drive or other mass storage device which may include code 1030, in one embodiment. The code 1030 may include instructions for performing embodiments of one or more of the methods described above. Further, an audio I/O 1024 may be coupled to second bus 1020.

Note that other embodiments are contemplated. For example, instead of the point-to-point architecture shown, a system may implement a multi-drop bus or another such communication topology. Also, the elements of FIG. 5 may alternatively be partitioned using more or fewer integrated chips than shown in the FIG. 5. For example, a field programmable gate array may share a single wafer with a processor element and memory including MTJs described herein.

As used herein, a "free" magnetic layer is a magnetic layer storing a computational variable. A "fixed" magnetic layer is a magnetic layer with fixed magnetization (magnetically harder than the free magnetic layer). A tunneling barrier, such as a tunneling dielectric (e.g., MgO) or tunneling oxide, is one located between free and fixed magnetic layers. A fixed magnetic layer may be patterned to create inputs and outputs to an associated circuit. Magnetization may be written by spin transfer torque effect while passing a current through the input electrodes. Magnetization may be read via the TMR effect while applying voltage to the output electrodes. In an embodiment, the role of the dielectric layer (e.g., dielectric layers 105, 107) is to cause a large magneto-resistance ratio. The magneto-resistance is the ratio of the difference between resistances when the two ferromagnetic layers have AP magnetizations and the resistance of the state with the parallel magnetizations.

MTJs described herein, such as pMTJs, function essentially as a resistor, where the resistance of an electrical path through the MTJ may exist in two resistive states, either "high" or "low," depending on the direction or orientation of magnetization in the free magnetic layer(s) (embodiments may have one or more free layers) and in the fixed magnetic layers. In the case that the spin direction is down (minority) in the free magnetic layer, a high resistive state exists, wherein direction of magnetization in the coupled free magnetic layer(s) and the dominant (i.e., most stable) fixed magnetic layer are substantially opposed or AP with one another. In the case that the spin direction is up (majority) in the coupled free magnetic layer(s), a low resistive state exists, wherein the direction of magnetization in the coupled free magnetic layer(s) and the dominant fixed magnetic layer (e.g., thickest Pt layer or more number Pt layers) is substantially aligned or P with one another. It is to be understood that the terms "low" and "high" with regard to the resistive state of the MTJ are relative to one another. In other words, the high resistive state is merely a detectably higher resistance than the low resistive state, and vice versa. Thus, with a detectable difference in resistance, the low and high resistive states can represent different bits of information (i.e. a "0" or a "1").

The direction of magnetization in the coupled free magnetic layers may be switched through STT using a spin-polarized current. An electrical current is generally non-polarized (e.g. consisting of about 50% spin-up and about 50% spin-down electrons). A spin polarized current is one with a greater number of electrons of either spin-up or spin-down, which may be generated by passing a current through the fixed magnetic layers. The electrons of the spin polarized current from the fixed magnetic layers tunnel through the tunneling barrier or dielectric layers and transfers its spin angular momentum to the free magnetic layer, wherein the free magnetic layer will orient its magnetic direction from AP to that of the dominant fixed magnetic layer or P. The free magnetic layer may be returned to its original orientation by reversing the current.

Thus, the pMTJ may store a single bit of information ("0" or "1") by its state of magnetization. The information stored in the MTJ is sensed by driving a current through the pMTJ. The free magnetic layer(s) does not require power to retain its magnetic orientations. As such, the state of the MTJ is preserved when power to the device is removed. Therefore, a STT memory bit cell composed of stack 200, is, in an embodiment, non-volatile.

Various embodiments addressed herein include a semiconductive substrate. Such a substrate may be a bulk semiconductive material this is part of a wafer. In an embodiment, the semiconductive substrate is a bulk semiconductive material as part of a chip that has been singulated from a wafer. In an embodiment, the semiconductive substrate is a semiconductive material that is formed above an insulator such as a semiconductor on insulator (SOI) substrate. In an embodiment, the semiconductive substrate is a prominent structure such as a fin that extends above a bulk semiconductive material.

The following examples pertain to further embodiments.

Example 1 includes a first electrode on a substrate; a second electrode between the first electrode and the substrate; a perpendicular magnetic tunnel junction (pMTJ), between the first and second electrodes, comprising a dielectric layer between a fixed layer and a free layer; a protective film directly contacting sidewalls of the first electrode; and a capping layer on sidewalls of the first electrode; wherein (a) a vertical axis intersects the first and second electrodes and the pMTJ but not the capping layer, (b) a first horizontal axis, orthogonal to the vertical axis, intersects the capping layer, the protective film, and the first electrode but not the pMTJ; and (c) a second horizontal axis, between the first horizontal axis and the pMTJ, intersects the protective film and the first electrode but not the capping layer or the pMTJ.

For example, in FIG. 2b vertical axis 240 does not intersect capping layer 211. Furthermore, axis 241 intersects capping layer 211 but axis 242 does not intersect capping layer 211.

In example 2 the subject matter of the Example 1 can optionally include wherein the first electrode includes a first material and the second electrode includes a second material; the apparatus further comprising a deposit, including the second material, on the sidewalls of the first electrode with a portion of the first protective film between the deposit and the sidewalls of the first electrode.

For example, deposit 231 (FIG. 2b) would include the re-deposit of materials from electrode 202. Axis 242 intersects deposit 231. Deposit 231 couples to first electrode 204 indirectly via layer 210 (thereby preventing a short should deposit 231 extend further down and contact MTJ layers and/or bottom electrode 202).

In example 3 the subject matter of the Examples 1-2 can optionally include wherein one of the sidewalls of the first electrode is substantially collinear with one sidewall of the second electrode.

In FIG. 3b axis 343 is generally or substantially (i.e., +/−5 degrees) collinear with the sidewalls of electrodes 302' and 304'. However, in FIG. 3a axis 345 (which is collinear with a bottom electrode sidewall of the device on the left of FIG.

3b) is not collinear with axis 344 (which is collinear with a top electrode sidewall of the device on the left of FIG. 3b).

In example 4 the subject matter of the Examples 1-3 can optionally include wherein the first material includes at least one of tantalum (Ta), titanium (Ti), titanium nitride (TiN), and the second material includes at least one of Ruthenium (Ru) and copper (Cu).

In example 5 the subject matter of the Examples 1-4 can optionally include wherein the capping layer does not include the second material.

In example 6 the subject matter of the Examples 1-5 can optionally include wherein the protective film is non-conductive.

For example, the protective film could be a dioxide. Obviously, "non-conductive" would be relative to something like a conducting metal layer.

In example 7 the subject matter of the Examples 1-6 can optionally include wherein the capping layer includes at least one of titanium (Ti), titanium nitride (TiN), tantalum (Ta), tungsten (W), and tantalum nitride (TaN).

For example, a material including TiX, where X is some element other than Ti, "includes Ti" as that phrase is used herein.

In example 8 the subject matter of the Examples 1-7 can optionally include wherein the protective film includes a dielectric.

In example 9 the subject matter of the Examples 1-8 can optionally include wherein the protective film directly contacts the pMTJ (or MTJ).

For example, see areas 232, 233 of FIG. 2b.

In example 10 the subject matter of the Examples 1-9 can optionally include wherein the protective film directly contacts an upper surface portion of the pMTJ on one side of the first electrode and another upper surface portion of the pMTJ on another side of the first electrode.

In example 11 the subject matter of the Examples 1-10 can optionally include wherein the capping layer extends from a top portion of a sidewall of the first electrode downwards and does not extend more than half way down the sidewall the first electrode; wherein the capping layer is not on top of the first electrode.

Such an example is shown in FIG. 2b.

In example 12 the subject matter of the Examples 1-11 can optionally include wherein an upper half of the top electrode has a minimum diameter and the lower half of the bottom electrode has a maximum diameter that is no more than 200% of the minimum diameter.

For example, in FIG. 3a width or diameter 346 (diameter of bottom electrode) is almost 600% of diameter 347 (diameter of top electrode). However, in FIG. 3b diameter 348 (diameter of bottom electrode) is likely only 175% of diameter 349 (diameter of top electrode).

In example 13 the subject matter of the Examples 1-12 can optionally include a processor; a memory, coupled to the processor, including an apparatus according to any one of claims 1 to 12; and a communication module, coupled to the processor, to communicate with a computing node external to the system.

A communication module may include, for example, element 1026 of FIG. 4, a wireless radio interface, antennae, OFDM module, and the like.

In example 14 the subject matter of the Examples 1-13 can optionally include a mobile computing node including a non-volatile memory that comprises the pMTJ.

Example 15 includes a method comprising: form a first electrode with exposed sidewalls and an exposed top surface; form a non-conductive protective film directly contacting the sidewalls and the top surface of the first electrode; form a capping layer on sidewalls of the protective film and a top surface of the protective film, the capping layer extending from a top portion of a sidewall of the first electrode downwards but not more than half way down the sidewall the first electrode; etch a metal layer to form a magnetic tunnel junction (MTJ), and etch an additional metal layer to form a second electrode, below the MTJ and the first electrode, using an etchant while the capping layer is on the sidewalls of the protective film and the top surface of the protective film and while the protective film directly contacts the sidewalls and the top surface of the first electrode.

In example 16 the subject matter of the Example 15 can optionally include wherein (a) the first electrode includes a first material, the second electrode includes a second material, and the capping layer includes a capping material, and (b) the etchant is more selective to the second material than the capping material.

Such an example is shown in FIG. 2b. During a bottom electrode etching process, the highly selective material 211 will exhibit little to no etching (removal), while the bottom electrode 202 material may be etched at a much higher rate. In an embodiment, the highly selective material may be etched at a rate that may be about 100 to about 1000 times less than the etch rate for the bottom electrode 202, for a given bottom electrode 202 etch chemistry.

In example 17 the subject matter of the Examples 15-16 can optionally include wherein after etching the second electrode: (a) a vertical axis intersects the first and second electrodes and the MTJ but not the capping layer, (b) a first horizontal axis, orthogonal to the vertical axis, intersects the capping layer, the protective film, and the first electrode but not the MTJ; and (c) a second horizontal axis, between the first horizontal axis and the MTJ, intersects the protective film and the first electrode but not the capping layer or the MTJ.

In example 18 the subject matter of the Examples 15-17 can optionally include forming a deposit, including the second material, on the sidewalls of the first electrode with a portion of the first protective film between the deposit and the sidewalls of the first electrode; wherein the second horizontal axis intersects the deposit.

Example 19 includes an apparatus comprising: a magnetic tunnel junction (MTJ), between first and second electrodes, comprising a dielectric layer between fixed and free layers; a dielectric film directly contacting sidewalls of the first electrode; and a metallic layer coupled to the sidewalls via the dielectric film; wherein (a) a vertical axis intersects the first and second electrodes and the MTJ but not the metallic layer, (b) a first horizontal axis intersects the metallic layer, the dielectric film, and the first electrode; and (c) a second horizontal axis, between the first horizontal axis and the MTJ, intersects the dielectric film and the first electrode but not the capping layer.

In example 20 the subject matter of the Example 19 can optionally include wherein the first electrode includes a first material and the second electrode includes a second material; the apparatus further comprising a deposit, including the second material, on the sidewalls of the first electrode with a portion of the dielectric film between the deposit and the sidewalls of the first electrode.

In example 21 the subject matter of the Examples 19-20 can optionally include wherein the dielectric film directly contacts the pMTJ.

In example 22 the subject matter of the Examples 20-21 can optionally include wherein the dielectric film directly contacts an upper surface portion of the MTJ on one side of the first electrode and another upper surface portion of the MTJ on another side of the first electrode.

In example 23 the subject matter of the Examples 20-22 can optionally include wherein the vertical axis intersects the first and second electrodes and the MTJ but not the metallic layer.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. An apparatus comprising:
   a first electrode on a substrate;
   a second electrode between the first electrode and the substrate;
   a perpendicular magnetic tunnel junction (pMTJ), between the first and second electrodes, comprising a dielectric layer between a fixed layer and a free layer;
   a protective film directly contacting sidewalls of the first electrode; and
   a capping layer on sidewalls of the first electrode;
   wherein (a) a vertical axis intersects the first and second electrodes and the pMTJ but not the capping layer, (b) a first horizontal axis, orthogonal to the vertical axis, intersects the capping layer, the protective film, and the first electrode but not the pMTJ; and (c) a second horizontal axis, between the first horizontal axis and the pMTJ, intersects the protective film and the first electrode but not the capping layer or the pMTJ.

2. The apparatus of claim 1,
   wherein the first electrode includes a first material and the second electrode includes a second material;
   the apparatus further comprising a deposit, including the second material, on the sidewalls of the first electrode with a portion of the first protective film between the deposit and the sidewalls of the first electrode.

3. The apparatus of claim 2, wherein one of the sidewalls of the first electrode is substantially collinear with one sidewall of the second electrode.

4. The apparatus of claim 2, wherein the first material includes at least one of tantalum (Ta), titanium (Ti), titanium nitride (TiN), and the second material includes at least one of Ruthenium (Ru) and copper (Cu).

5. The apparatus of claim 4, wherein the capping layer does not include the second material.

6. The apparatus of claim 1, wherein the protective film is non-conductive.

7. The apparatus of claim 6, wherein the capping layer includes at least one of titanium (Ti), titanium nitride (TiN), tantalum (Ta), tungsten (W), and tantalum nitride (TaN).

8. The apparatus of claim 6, wherein the protective film includes a dielectric.

9. The apparatus of claim 6, wherein the protective film directly contacts the pMTJ.

10. The apparatus of claim 9, wherein the protective film directly contacts an upper surface portion of the pMTJ on one side of the first electrode and another upper surface portion of the pMTJ on another side of the first electrode.

11. The apparatus of claim 1,
    wherein the capping layer extends from a top portion of a sidewall of the first electrode downwards and does not extend more than half way down the sidewall of the first electrode;
    wherein the capping layer is not on top of the first electrode.

12. The apparatus of claim 1, wherein an upper half of the top electrode has a minimum diameter and a lower half of the bottom electrode has a maximum diameter that is no more than 200% of the minimum diameter.

13. A system comprising:
    a processor;
    a memory, coupled to the processor, including an apparatus according to claim 1; and
    a communication module, coupled to the processor, to communicate with a computing node external to the system.

14. The apparatus of claim 1 comprising a mobile computing node including a non-volatile memory that comprises the pMTJ.

15. An apparatus comprising:
    a magnetic tunnel junction (MTJ), between first and second electrodes, comprising a dielectric layer between fixed and free layers;
    a dielectric film directly contacting sidewalls of the first electrode; and
    a metallic layer coupled to the sidewalls via the dielectric film;
    wherein (a) a vertical axis intersects the first and second electrodes and the MTJ, (b) a first horizontal axis intersects the metallic layer, the dielectric film, and the first electrode; and (c) a second horizontal axis, between the first horizontal axis and the MTJ, intersects the dielectric film and the first electrode but not the capping layer.

16. The apparatus of claim 15,
    wherein the first electrode includes a first material and the second electrode includes a second material;
    the apparatus further comprising a deposit, including the second material, on the sidewalls of the first electrode with a portion of the dielectric film between the deposit and the sidewalls of the first electrode.

17. The apparatus of claim 15, wherein the dielectric film directly contacts the MTJ.

18. The apparatus of claim 17, wherein the dielectric film directly contacts an upper surface portion of the MTJ on one side of the first electrode and another upper surface portion of the MTJ on another side of the first electrode.

19. The apparatus of claim 17, wherein the vertical axis intersects the first and second electrodes and the MTJ but not the metallic layer.

* * * * *